(12) United States Patent
Groe et al.

(10) Patent No.: US 7,999,608 B1
(45) Date of Patent: Aug. 16, 2011

(54) INTEGRATED RF NOTCH FILTERS

(75) Inventors: John B. Groe, Poway, CA (US); Lucio Marc Facchni, San Diego, CA (US)

(73) Assignee: Quintic Holdings, Santa Clara, CA (US)

( * ) Notice: Subject to any disclaimer, the term of this patent is extended or adjusted under 35 U.S.C. 154(b) by 0 days.

(21) Appl. No.: 12/496,419

(22) Filed: Jul. 1, 2009

Related U.S. Application Data

(60) Provisional application No. 61/077,437, filed on Jul. 1, 2008.

(51) Int. Cl.
*H03K 5/00* (2006.01)
(52) U.S. Cl. .................. 327/556; 327/552; 455/307
(58) Field of Classification Search .......... 327/551–559; 455/307, 333
See application file for complete search history.

(56) References Cited

U.S. PATENT DOCUMENTS

| | | | | |
|---|---|---|---|---|
| 7,389,098 | B2 * | 6/2008 | Oh et al. | 455/285 |
| 7,522,024 | B2 * | 4/2009 | Beffa | 333/217 |
| 7,885,629 | B2 * | 2/2011 | Ojo et al. | 455/307 |
| 2008/0079497 | A1 * | 4/2008 | Fang et al. | 330/302 |

* cited by examiner

*Primary Examiner* — Dinh T. Le
(74) *Attorney, Agent, or Firm* — Blairtech Solution LLC

(57) ABSTRACT

Apparatus and methods for providing integrated RF notch filter subsystems having enhanced Q values are described. An integrated notch filter includes an LC filter element and a Q-enhancement circuit coupled to the LC filter element, with the Q-enhancement circuit configured to offset resistive losses in the LC filter element to adjust the Q value of the filter system. A transceiver having multiple LNAs for various bands may be provided to a single notch filter system including a Q-enhancement circuit.

14 Claims, 8 Drawing Sheets

Transmit Leakage Signal in Full Duplex System
(PRIOR ART)

LNA with Shunt-type Notch Filter Without Compensation

LNA with Shunt-type Notch Filter with an Embodiment of Q-enhancement

Response of LNA Load with Notch Filter

Effect of Negative Conductance on Filter Q

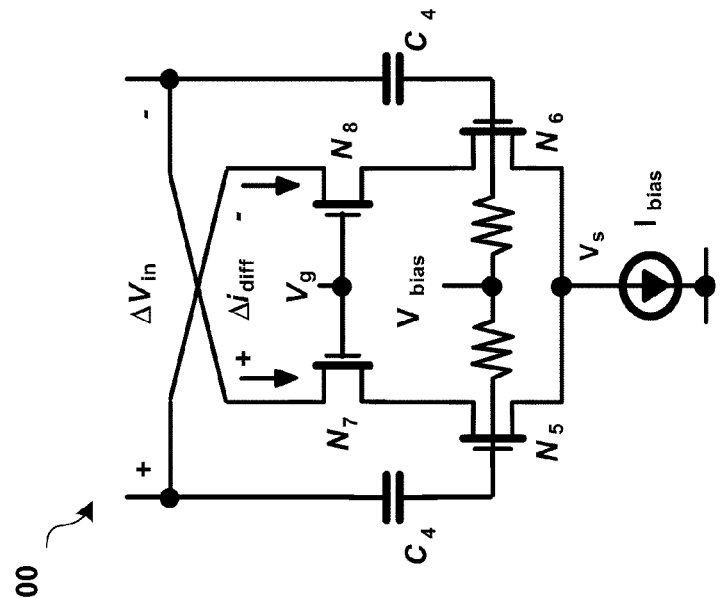
FIG 6 An Embodiment of a Q Enhancement Circuit Based on a Differential Pair
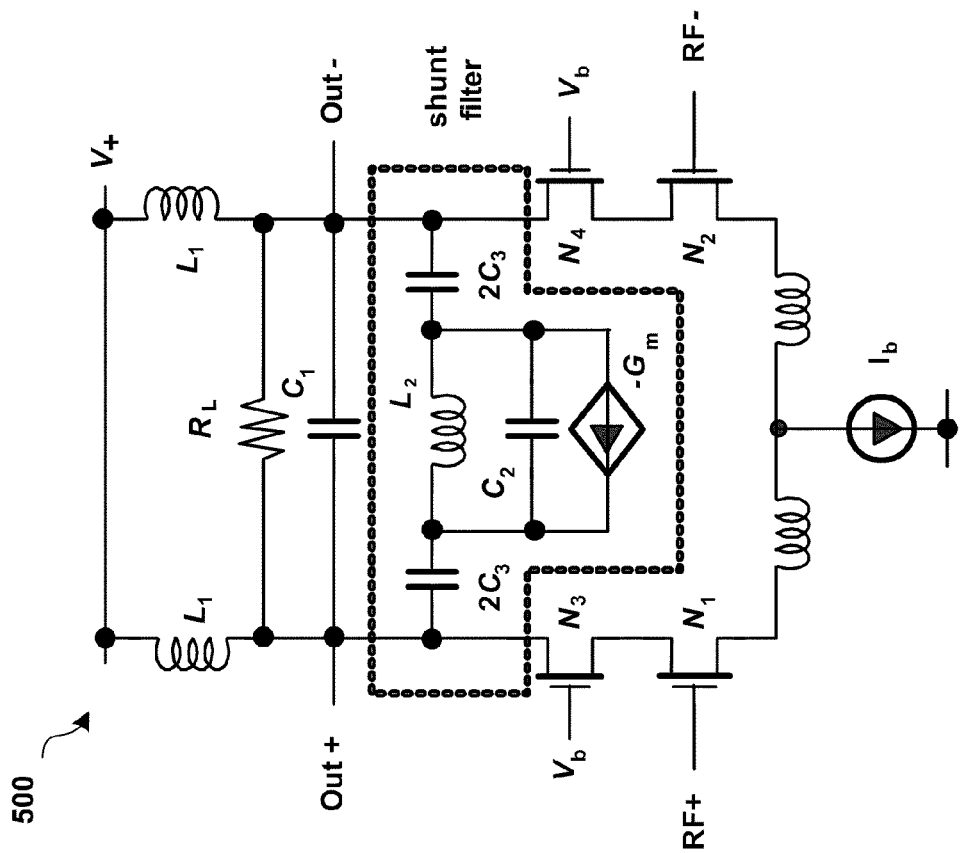
FIG 5 Differential Notch Filter Using Q Enhancement An Embodiment of A Resistively
Degenerated Q Enhancement Circuit Sensitivity of $-G_m$ Value to signal level Sensitivity of $-G_m$ Value to temperature Switched Resistor Variable MOSFET Resistor An Embodiment of a Multi-band Front End

INTEGRATED RF NOTCH FILTERS

CROSS REFERENCE TO RELATED APPLICATIONS

This application claims priority under 35 U.S.C. §119(e) to U.S. Provisional Patent Application Ser. No. 61/077,437, entitled INTEGRATED RF NOTCH FILTERS, filed on Jul. 1, 2008. This application is also related to U.S. Utility patent application Ser. No. 11/111,680, now U.S. Pat. No. 7,522,017, entitled HIGH-Q INTEGRATED FILTERS. The content of each of these applications is hereby incorporated by reference herein in its entirety for all purposes.

FIELD OF THE INVENTION

The present invention relates generally to high-Q integrated filters for operation at RF frequencies and their associated tuning. More specifically but not exclusively, the present invention relates to shunt-type notch filters having coupled negative conductance elements.

BACKGROUND

Filters find widespread use in radio transceivers, as shown in FIG. 1. Filters such as those shown in FIG. 1 are used to limit noise while attenuating potentially interfering signals as well as spurious signals. Most communication systems require RF filters with sharp frequency responses (i.e., notches) that make monolithic integration difficult. As a result, RF filters typically use bulky technologies, such as surface acoustic wave (SAW) or ceramic resonators. It would therefore be desirable to find methods and apparatus to provide more flexible and more readily integratable RF filters, as well as provide other advantages.

SUMMARY

The present invention is directed generally to filter enhancements. In various embodiments, a pair of LC filters and a Q-enhancement circuit are described, which can be integrated to overcome problems associated with conventional filters as well as provide other advantages. The LC filters provide a sharp frequency notch, while the Q-enhancement circuit creates a negative conductance/resistance to improve the quality factor (Q) of the illustrated LC resonator, as well as other LC or other tuned resonators.

Because the filters and Q-enhancement circuit can be integrated in various embodiments, they are suitable for use in a variety of radio transceiver applications where conventional circuits may be too bulky or expensive.

More particularly, in one aspect, the present invention is directed to a filter system comprising a resonate shunt-type LC notch filter and a Q-enhancement circuit coupled to the resonate shunt-type LC notch filter, with the Q-enhancement circuit configured to generate a negative resistance so as to at least partially offset a resistance in the notch filter.

In another aspect, the present invention is directed to a filter system for use with a multi-band transceiver, the filter system comprising a plurality of switchable LNA inputs disposed to receive input signals from two or more LNA stages such that one LNA stage of the plurality of LNA stages is active at a particular time, an inductive load element, a capacitive element coupled to the inductive load element, a resonate shunt-type LC notch filter coupled to the capacitive element and load element and a Q-enhancement circuit coupled to the resonate shunt-type LC notch filter, wherein the resonate shunt-type LC notch filter is further coupled to ones of the plurality of LNAs responsive to selection of one of the switchable LNA inputs.

In yet another aspect, the present invention is directed to a method of filtering a received signal in a transceiver, comprising providing a received signal to a notch filter system in the transceiver and filtering the received signal in the notch filter system, wherein the notch filter system includes an LC shunt circuit and a Q-enhancement circuit coupled to the LC shunt circuit, and wherein the Q-enhancement circuit generates a negative resistance to at least partially offset a resistance in the LC shunt circuit so as to enhance the Q of the notch filter system.

Additional aspects of the present invention are described below in conjunction with the appended drawings.

BRIEF DESCRIPTION OF THE DRAWINGS

The foregoing aspects and the attendant advantages of the described embodiments will become more readily apparent by reference to the following detailed description when taken in conjunction with the accompanying drawings wherein:

FIG. 5 shows an embodiment of a differential LNA and shunt-type LC notch filter;

FIG. 6 shows an embodiment of a Q-enhancement circuit used to improve the performance of the shunt-type LC notch filter, in accordance with aspects of the present invention;

DETAILED DESCRIPTION

Figure 1:
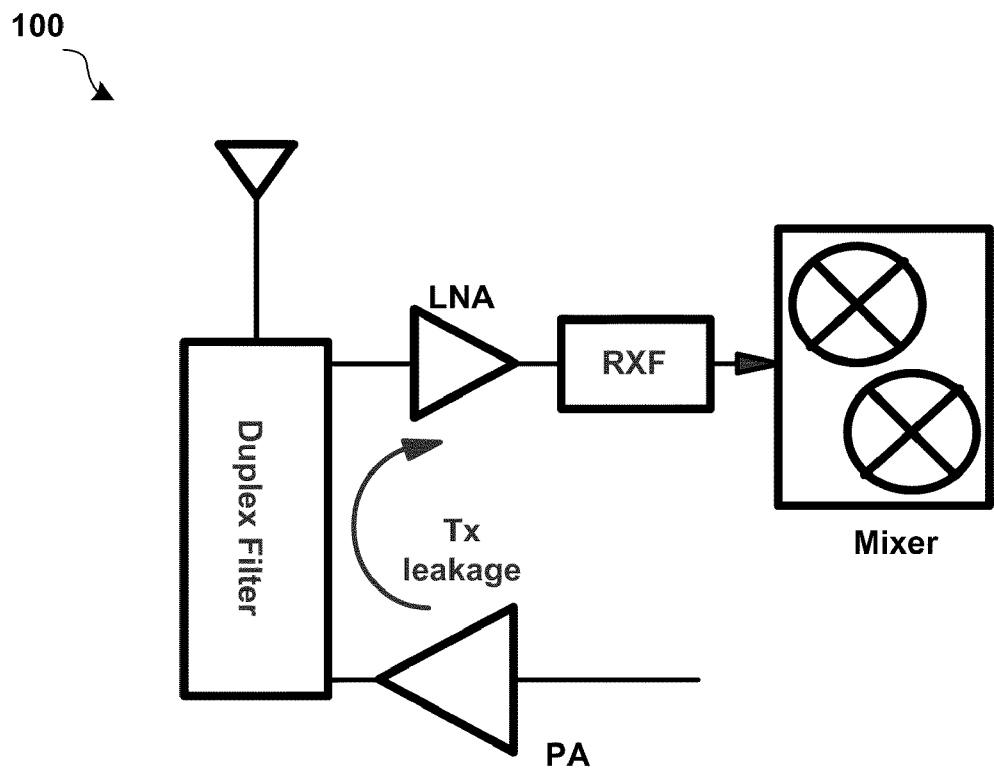
FIG. 1 is a diagram of a full duplex radio transceiver and the transmit leakage signal.

In many communication systems an RF downcoverter, such as may be used in a transceiver, must be configured to accept a broad range of signals. In full duplex systems, the strongest of these is potentially the transmit leakage signal. This signal can easily overdrive the downconverting mixer and produce debilitating distortion. To prevent this, the RF downconverter generally includes a SAW filter after the LNA and before the mixer, as shown in circuit 100 of FIG. 1.

Figure 2A:
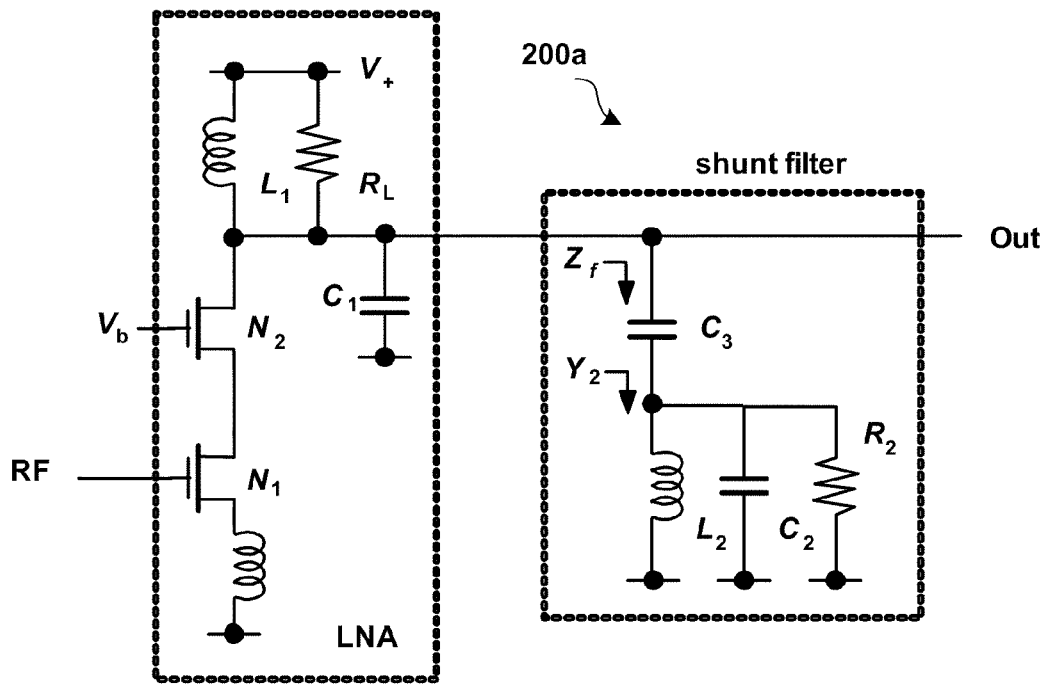
FIG. 2a is a diagram of an LNA and shunt-type LC notch filter without compensation.

It is possible to attenuate the transmit leakage signal using a simple notch filter. FIG. 2*a* shows an embodiment of a shunt-type notch filter 200*a* that connects to the LNA output load. Ideally, the notch filter presents an impedance transfer function with a zero at the transmit frequency $f_{Tx}$ and a pole at the receive frequency $f_{Rx}$.

The shunt-type notch filter consists of a parallel LC circuit and an impedance-transforming coupling capacitor $C_3$. An imaginary resistor $R_2$ models the losses associated with the network. In practice, these losses degrade the filter's quality factor (Q) and the notch attenuation. The resulting parallel RLC combination presents an admittance $Y_2$ given by $$Y_2 = 1sL_2 + sC_2 + 1/R_2 \quad (1)$$

Figure 2B:
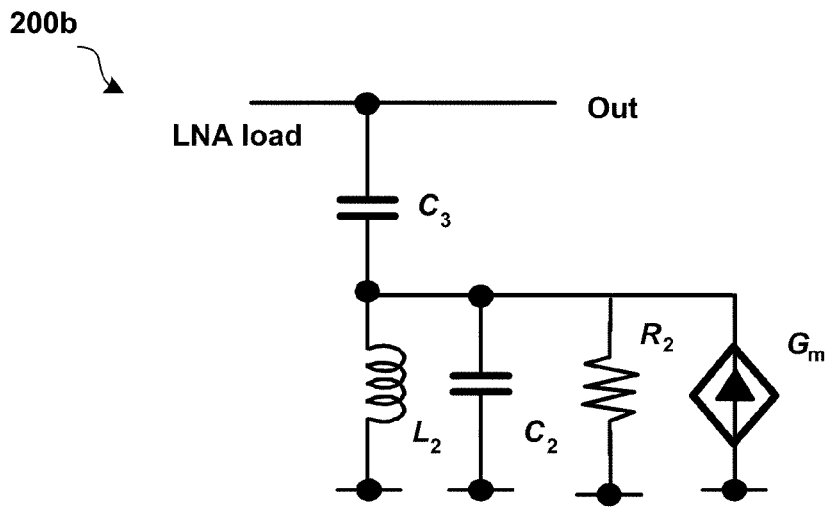
FIG. 2b is a diagram of an embodiment of a shunt-type LC filter with Q-enhancement, in accordance with aspects of the present invention.

Adding a negative conductance $-G_m$ to compensate the loss modeled by resistor $R_2$, as shown in the embodiment 200*b* of FIG. 2*b*, can be used to enhance the filter system's Q value and correspondingly improve the notch's attenuation. The notch filter in turn presents an impedance $Z_f$ in shunt with the LNA load described by $$Z_f = 1/(Y_2 - G_m) + 1/sC_3 \quad (2)$$

Substituting (1) into (2) yields $$Z_f = \frac{1}{1/sL_2 + sC_2 + 1/R_2 - G_m} + \frac{1}{sC_3} \quad (3)$$

which simplifies to $$Z_f = \beta \frac{s^2 + sG/(C_2+C_3) + 1/L_2(C_2+C_3)}{s(s^2 + sG/C_2 + 1/L_2C_2)} \quad (4)$$

where $G = 1/R_2 - G_m$ and $\beta = (C_2+C_3)/C_2C_3$.

Mapping the denominator and numerator to the general second order expression $s^2 + 2\zeta\omega_n s + \omega_n^2$ reveals the pole/zero locations as $$\omega_z = \sqrt{1/L_2(C_2+C_3)} \quad \omega_p = \sqrt{1/L_2C_2} \quad (5)$$

Note that $\omega_z < \omega_4$ and this matches the relative positive of $f_{Tx}$ and $f_{Rx}$. In practice, capacitor $C_3$ should be kept small to position $\omega_z$ close to $\omega_p$.

By design, the shunt network typically affects the load impedance of the LNA. At the zero frequency $\omega_z$, the notch filter shorts out the load and attenuates the transmit leakage signal. In contrast, the notch filter has little or no effect on the LNA load and the receive signal at the pole frequency $\omega_4$. As a result, the shunt structure minimizes insertion loss and added noise.

Figure 3:
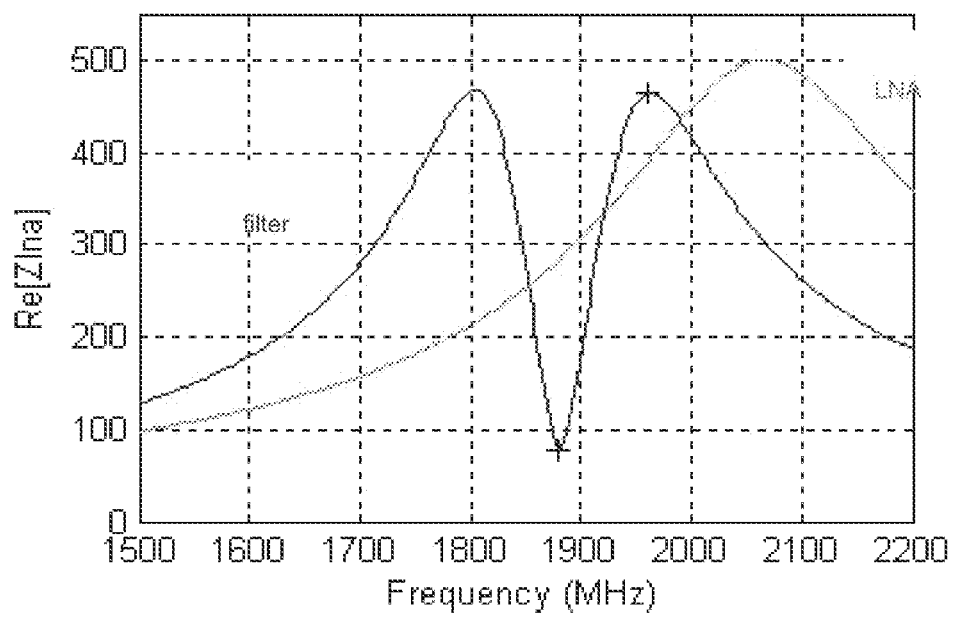
FIG. 3 shows the frequency response of a shunt-type LC notch filter.

FIG. 3 shows the frequency response of the LNA load and notch filter system. The value of capacitor $C_2$ is adjusted first to position the zero and notch the transmit signal. Then, the value of capacitor $C_1$ is trimmed to resonate the combined load at the receive frequency. In practice, it is fairly straightforward to adjust these capacitors and tune the notch frequency over a wide bandwidth.

As designed, the filter system's zero creates a notch in the response that attenuates the signal energy at the transmit frequency. The filter also adds a small capacitance to the LNA's output and shifts the load's resonance downward. Lastly, the shunt structure of the filter advantageously introduces less than 1 dB insertion loss.

The depth of the notch and the Q of the filter depend on the negative conductance (reciprocal resistance) $-G_m$ added to the parallel LC combination (and lossy element $R_2$) in the filter system. In practice, the response of the notch filter peaks when the negative conductance value $-G_m$ exactly cancels the loss modeled by imaginary resistor $R_2$ with $$-1/G_m = R_2 \quad (6)$$

Figure 4:
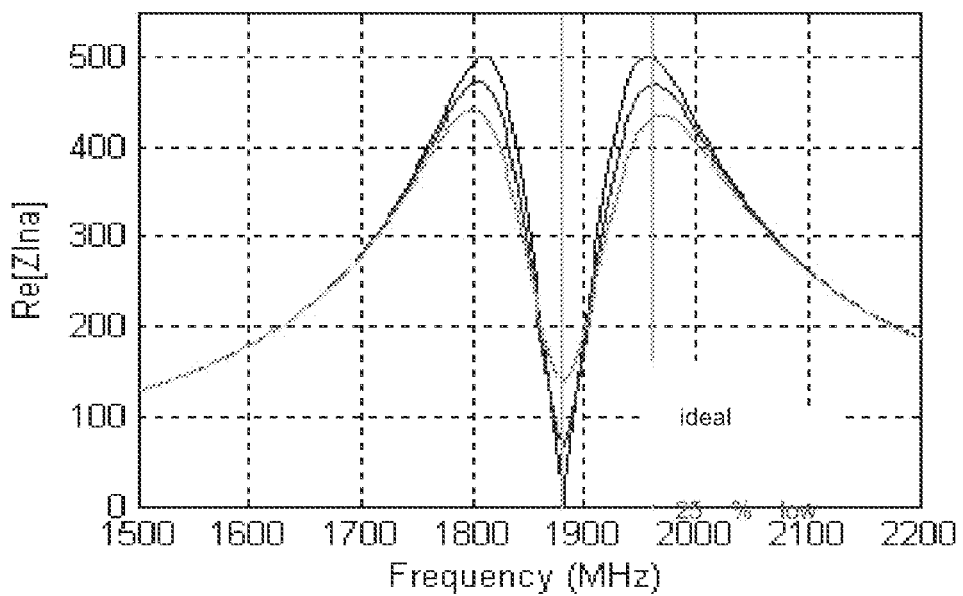
FIG. 4 illustrates the effect of negative conductance (provided by the Q-enhancement circuit) on the shunt-type LC notch filter, in accordance with aspects of the present invention.

FIG. 4 illustrates this relationship. Note that even with the $-G_m$ value set 25% low, the attenuation approaches 15 dB.

The single-ended shunt-type notch filter embodiment 200*b* as shown in FIG. 2*b* can be modified to operate in differential designs as well. FIG. 5 illustrates an embodiment 500 of a differential structure using only two inductors and a negative conductance element $(-G_m)$ to enhance Q (Inductor $L_1$ is a center-tapped differential structure).

The Q-enhancement circuit that connects across the parallel LC network senses the applied voltage and develops a current opposite to this voltage. The negative conductance $-G_m$ equals $$G_m = \frac{\text{rms}\{i_{out}(t)\}}{\text{rms}\{v_{in}(t)\}} \quad (7)$$

where rms { } represents the root-mean-squared or effective value of the argument. By definition, the root-mean-squared value equals $$\text{rms}\{i\} \Box \left[\frac{1}{T}\int_T i^2(t)\,dt\right]^{1/2} \quad (8)$$

In practice, the amplified transmit leakage signal drives the Q-enhancement circuit towards large-signal operation.

One embodiment of a Q-enhancement circuit is the differential pair circuit 600 shown in FIG. 6. Capacitors $C_4$ couple the signal to the input transistors and allow independent biasing of the devices. These capacitors also form a capacitor divider with the gate-source capacitance of the MOS transistors that attenuates the input signal according to $$\alpha = \frac{v_{in}}{v_{diff}} \approx \frac{C_4}{C_4 + C_{gs}} \quad (9)$$

assuming an ac ground at the source-coupled node $V_s$. As such, the drain current for each device comprising the differential pair adheres to the square-law relationship where $$i_{D5} = K_1(\alpha v_{in} + V_{bias} - V_s - V_T)$$

$$i_{D6} = K_2(-\alpha v_{in} + V_{bias} - V_s - V_T)^2 \quad (10)$$

with the intrinsic gain K representing $\frac{1}{2}\mu C_{ox}(W/L)$. It follows then that the output current becomes simply $$\Delta i_{out} = i_{D6} - i_{D5} \quad (11)$$

where the cross-coupling of the output realizes the negative conductance. It's important to note that the transconductance of the differential pair varies with the bias current $I_{bias}$ and allows a straightforward means to adjust the $-G_m$ value (and the notch attenuation).

Unfortunately, the square-law behavior of the MOS devices makes the $-G_m$ value potentially sensitive to the amplitude of the input signal $v_{in}$ and consequently the transmit signal leakage level. In practice, the $-G_m$ value of the simple differential pair increases as the input signal level decreases. Furthermore, the $-G_m$ value falls at high temperatures due to the lower intrinsic gain of MOS transistors. This makes the $-G_m$ value sensitive to both the transmit power level and temperature.

Figure 7:
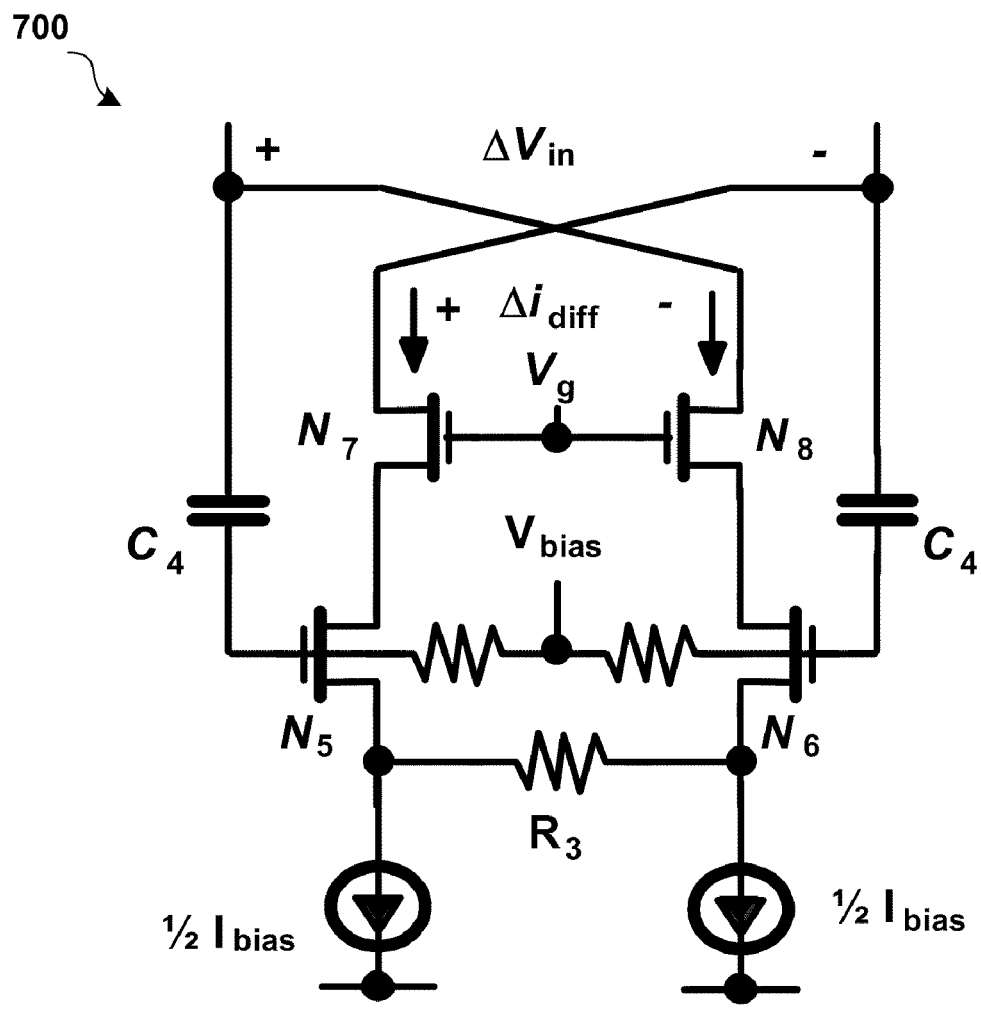
FIG. 7 shows an embodiment of an alternative Q-enhancement circuit used to improve the performance of the shunt-type LC notch filter, in accordance with aspects of the present invention.
Figure 8A:
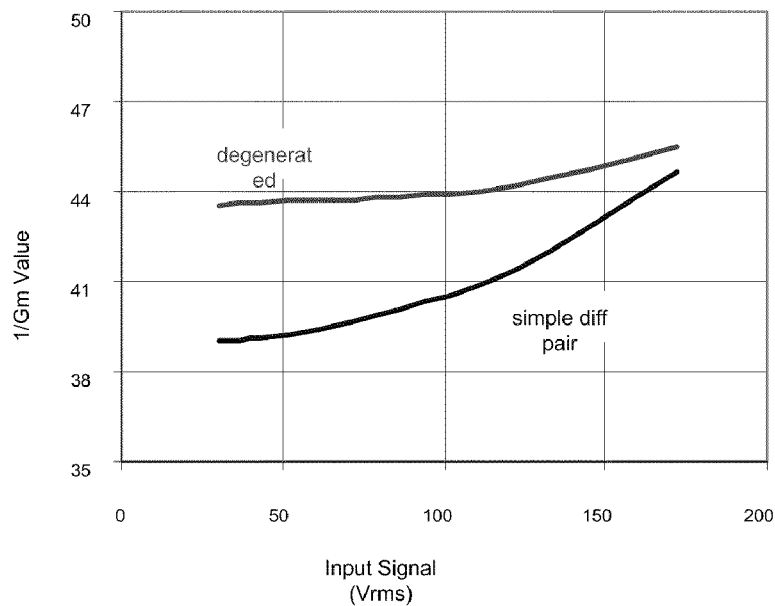
FIG. 8a is a plot of negative conductance sensitivity as a function of input signal level.
Figure 8B:
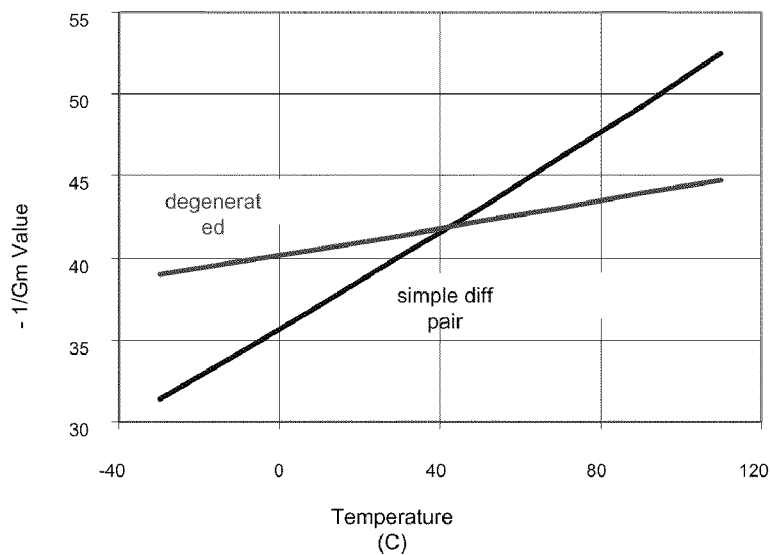
FIG. 8b is a plot of negative conductance sensitivity as a function of temperature.

Adding a resistor $R_3$ to the differential pair as shown in circuit 700 of FIG. 7 reduces the variation in the circuit's transconductance. It accomplishes this by introducing local feedback that linearizes the MOSFET square-law response. In this implementation, the $-G_m$ value stays relatively constant as the amplitude of the input signal $v_{in}$ changes or the operating temperature changes as shown in FIG. 8. Tuning becomes a little more challenging as the value of resistor $R_3$ must now be adjusted.

Figure 9:
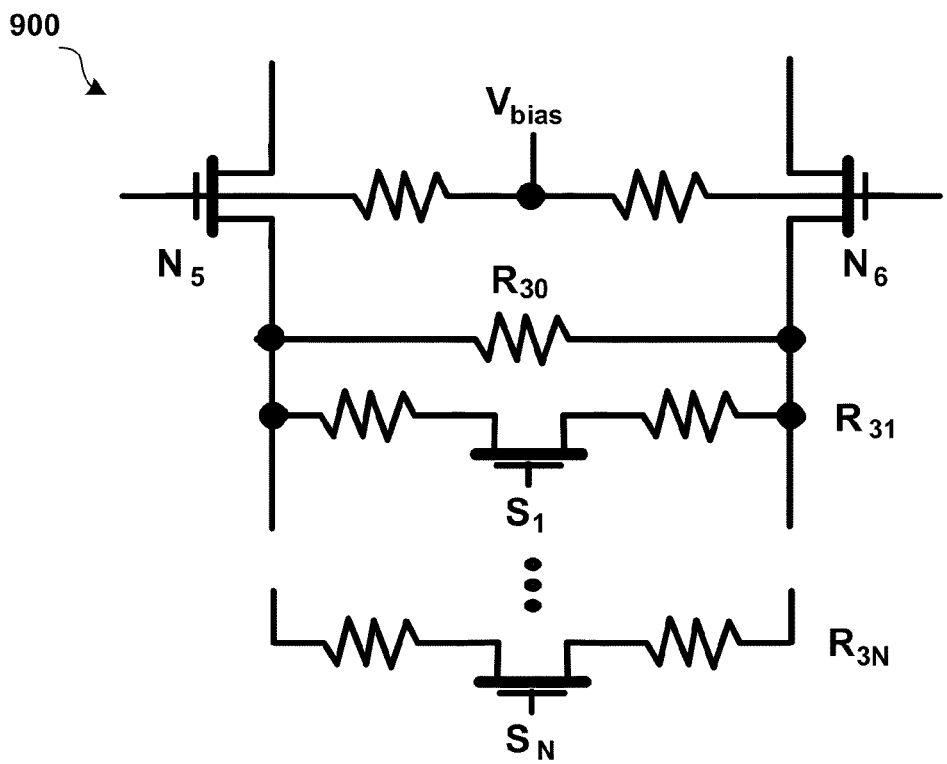
FIG. 9 is an embodiment of a circuit to realize a tunable resistor, in accordance with aspects of the present invention.

To adjust the resistor value, a simple switched approach or a variable MOSFET resistor may be used. FIG. 9 shows an embodiment 900 of the switched-resistor approach. The maximum value possible equals the value of resistor $R_{30}$ and occurs with all the switches $S_1$–$S_n$ open. When switch $S_1$ closes, the effective resistance drops to $$R_3 = \frac{R_{30}R_{31}}{R_{30} + R_{31}} \quad (12)$$

where $R_{31} \gg R_{30}$ to realize a small step. The large value of shunt resistor $R_{31}$ conveniently reduces the effect of the switch resistance. Moreover, the low signal current flowing through this branch should also minimize any distortion due to the switch. Adding other switched-resistors extends the tuning range.

Figure 10:
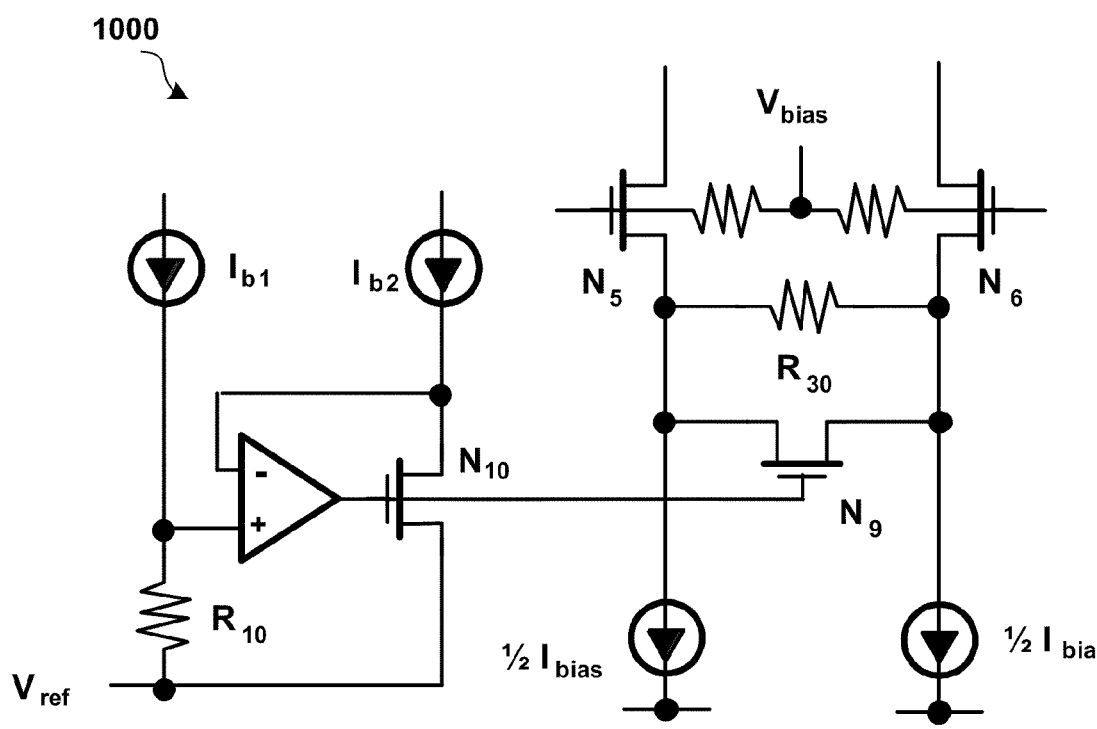
FIG. 10 is an embodiment of an alternate circuit to realize a tunable resistor, in accordance with aspects of the present invention.

FIG. 10 illustrates an embodiment 1000 of a variable MOSFET resistor. It uses a replica device (transistor $N_{10}$) and feedback circuit to adjust the resistance of the MOSFET device $N_9$. By design, the operational amplifier drives the voltage drop across transistor $N_{10}$ to equal $$I_{b1}R_{10} = V_{DS10} = I_{b2}r_{ds10} \quad (13)$$

where $r_{ds10}$ represents the channel resistance of transistor $N_{10}$. It follows that $$r_{ds10} = \frac{I_{b1}}{I_{b2}} R_{10} \quad (14)$$

which allows the variable resistor $N_{10}$ to be controlled by adjusting currents $I_{b1}$ and $I_{b2}$. The operational amplifier also drives transistor $N_9$ and ensures its resistance tracks that of transistor $N_{10}$. The reference voltage $V_{ref}$ matches the nominal voltage seen at the source terminals of the differential pair $N_9$-$N_{10}$ with $$V_{ref} = V_s = V_{bias} - V_T - \sqrt{I_{bias}2K} \quad (15)$$

The resistance seen by the Q-enhancement differential pair then equals the parallel combination of the variable MOSFET resistance due to transistor $N_9$ and resistor $R_{30}$.

Other Q-enhancement circuits are possible and envisioned within the scope of the present invention. These two examples represent only a few possible structures that are provided for purposes of illustration, not limitation. In addition, other tuned or resonator circuits, in addition to those LC circuits illustrated herein, may alternately be combined with a Q-enhancement circuit in various embodiments of the present invention so as to increase the Q value and enhance the filter notch characteristics.

The notch filter protects the receiver from strong transmit signals that leak around the duplex filter used to simultaneously connect the transmitter and receiver to the antenna. As such, in typically embodiments, it may only be needed at high transmit power levels. Therefore, in some embodiments, a filter system including the LC resonator and Q-enhancement circuit may further include switching elements configured to receive a transmit power level signal or other switching signal and selectively switch, in response to the transmit power level, the Q-enhancement circuit into or out of the filter system.

For example, to bypass the notch filter at low to medium transmit power levels, the zero frequency $\omega_z$ may be shifted away and the Q-enhancement circuit may be disabled. The low insertion loss of the shunt filter ensures the LNA gain changes only slightly. This approach may be used to simplify the AGC system, save current, and/or extend battery life.

Most receivers typically use a SAW filter to attenuate the transmit leakage signal. Unfortunately, SAW filters complicate the radio receiver. These SAW devices are off-chip devices and as such add design complexity, require matching networks, occupy valuable PCB area, and operate only in specific bands. As such, they multiply as the number of radio bands increase.

In general, multi-band receivers rely on multiple low-noise amplifiers to interface to the front-end and antenna. Each LNA includes an inductive load and this consumes die area. Moreover, integrating a notch filter for each band compounds this problem.

Figure 11:
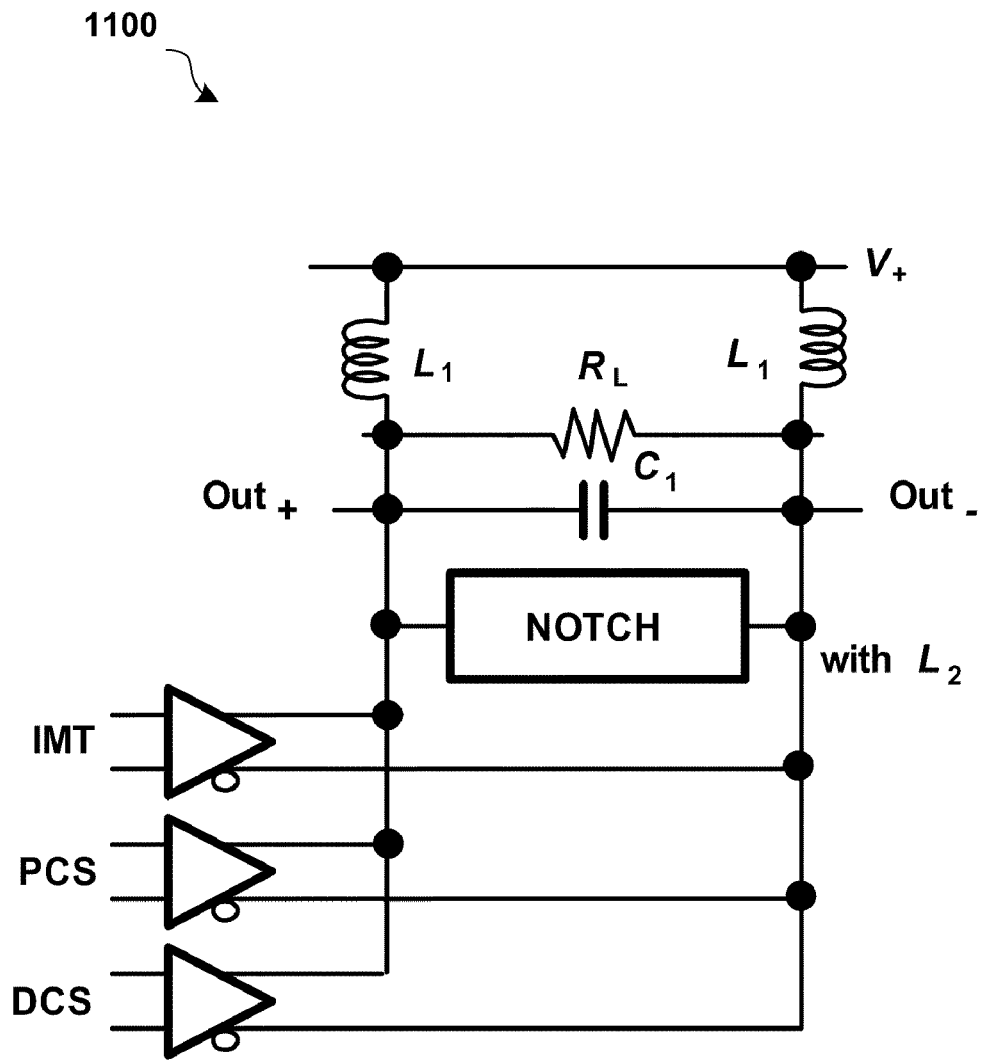
FIG. 11 is a diagram of an embodiment of a multi-band front-end circuit with multiple LNAs feeding a single shunt-type LC notch filter, in accordance with aspects of the present invention.

An alternative approach in accordance with aspects of the present invention provides multi-band coverage using only two inductors as shown in embodiment 1100 of FIG. 11. Multiple LNA stages—with differential current outputs—feed a single network that includes the inductive load and notch filter (the figure shows three LNA stages for illustration purposes, however, it is noted that other numbers and configurations of stages are within the spirit and scope of the present invention). The unused LNA stages are switched off using the input bias voltage source ($V_b$ in FIG. 5) and the cascode devices. This adds some capacitance to the network which can be resonated out by the load inductor. Coarse-tuning capacitor structures allow a wide tuning range for the LNA load and notch filter. In addition, the Q-enhancement circuit compensates any filter losses.

The shunt-type filter structure illustrated in the embodiments described previously may be used to provide a very high-Q notch response with minimal insertion loss. It uses an active $-G_m$ circuit to compensate for LC losses that otherwise degrade filter Q and lessen notch attenuation. The filter may be tuned easily by sliding capacitors $C_1$ and $C_2$. Moreover, the shunt structure minimizes effects on interstage matching. Lastly, the notch filter easily extends to multi-band applications.

The shunt-type notch filter provides an alternate approach to attenuate the transmit leakage signal and thus eliminate the need for a SAW filter in many communications applications. In some embodiments, the present invention may be implemented as a notch filter subsystem of a communications device such as a transceiver. In addition, the functionality described herein may be integrated, in whole or in part, into an integrated monolithic device such as a communications chip (integrated circuit) along with other transceiver components and/or subsystems.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications. They thereby enable others skilled in the art to best utilize the invention and various embodiments with various modifications as are suited to the particular use contemplated. It is intended that the following claims and their equivalents define the scope of the invention.

What is claimed is:

1. A filter system comprising:
   an LC notch filter, wherein losses associated with the notch filter are modeled by a resistance; and
   a Q-enhancement circuit coupled to the LC notch filter, said Q-enhancement circuit configured to generate a negative conductance so as to at least partially compensate the resistance in the notch filter, wherein the Q-enhancement circuit comprises a differential pair circuit, the differential pair circuit is configured to provide the negative conductance as an adjustable negative conductance responsive to a bias voltage, wherein the bias voltage is coupled to gates of a pair of transistors to supply a bias current to the differential pair circuit, wherein the differential pair is a MOSFET pair and the Q-enhancement circuit further comprises a local feedback circuit coupled between a first transistor of the MOSFET pair and a second transistor of the MOSFET pair and configured to linearize a square-law response characteristic of the MOSFET pair.

2. The filter system of claim 1 wherein the local feedback circuit comprises a resistive element coupled between the first transistor of the MOSFET pair and the second transistor of the MOSFET pair.

3. The filter system of claim 2 wherein the resistive element is a single resistor.

4. The filter system of claim 2 wherein the resistive element comprises:
   an adjustable resistor circuit having a plurality of resistive elements, and;
   a plurality of switching elements coupled to ones of the plurality of resistive elements, and wherein said plurality of switching elements are configured so as to switch one or more of the plurality of resistive elements into the adjustable resistor circuit so as to tune the Q-enhancement circuit.

5. A filter system comprising:
   an LC notch filter, wherein losses associated with the LC notch filter are modeled by a resistance;
   a Q-enhancement circuit coupled to the LC notch filter, said Q-enhancement circuit configured to generate a negative conductance so as to at least partially compensate the resistance in the LC notch filter; and
   a means for selectively disabling or enabling the Q-enhancement circuit in response to a level of a transmit power signal.

6. The filter system of claim 5 wherein the means for selectively disabling or enabling the Q-enhancement circuit disables the Q-enhancement circuit at low or moderate transmit power levels and enables the Q-enhancement circuit at high transmit power levels.

7. A filter system for use with a multi-band transceiver, the filter system comprising:
   a plurality of switchable LNA stages with differential current outputs; and
   a single network comprising:
      an inductive load element;
      a capacitive element coupled to the inductive load element;
      an LC notch filter coupled to the capacitive element and load element wherein losses associated with the LC notch filter are modeled by a resistance; and
      a Q-enhancement circuit coupled to the LC notch filter; wherein the LC notch filter is further coupled to ones of the plurality of switchable LNA stages responsive to selection of one of multi-band inputs and the Q-enhancement circuit is configured to generate a negative conductance so as to at least partially offset the resistance in the notch filter;
   wherein the current outputs are fed to the single network; and
   wherein the plurality of switchable LNA stages are disposed to receive multi-band inputs and ones of the plurality of switchable LNA stages unused can be switched off.

8. The filter system of claim 7 wherein ones of the plurality of switchable LNA stages unused are configured to be switched off using an input bias voltage source coupled to the filter system.

9. A method of filtering a received signal in a transceiver, comprising:
   providing a received signal to an LC notch filter subsystem of the transceiver; and
   filtering the received signal in the LC notch filter subsystem, wherein the notch filter subsystem includes an LC shunt circuit and a Q-enhancement circuit coupled to the LC shunt circuit, wherein losses associated with the LC shunt circuit are modeled by a resistance and the Q-enhancement circuit generates a negative conductance to at least partially compensate the resistance in the LC shunt circuit so as to enhance the Q of the notch filter subsystem;
   wherein the Q-enhancement circuit comprises a differential pair circuit, the differential pair circuit is configured to provide the negative conductance as an adjustable negative conductance responsive to a bias voltage, wherein the bias voltage is coupled to gates of a pair of transistors to supply a bias current to the differential pair circuit; and
   wherein the differential pair is a MOSFET pair and the Q-enhancement circuit linearizes a square-law response characteristic of the MOSFET pair using a feedback circuit coupled between a first transistor of the MOSFET pair and a second transistor of the MOSFET pair.

10. The method of claim 9 wherein the feedback circuit comprises a resistive element coupled between the first transistor of the MOSFET pair and the second transistor of the MOSFET pair.

11. The method of claim 10 wherein the resistive element comprises a plurality of resistors and a plurality of switches, and wherein one or more of the plurality of resistors and a plurality of switches, and wherein one more of the plurality of resistors is switched into the Q-enhancement circuit by one or more of the plurality of switches so as to tune the Q-enhancement circuit.

12. A method of filtering a received signal in a transceiver, comprising:
   providing received signal to an LC notch filter subsystem of the transceiver;
   filtering the received signal in the LC notch filter subsystem, wherein the LC notch filter subsystem includes an LC shunt circuit and a Q-enhancement circuit coupled to the LC shunt circuit, wherein losses associated with the LC shunt circuit are modeled by a resistance and the Q-enhancement circuit generates a negative conductance to at least partially compensate the resistance in the LC shunt circuit so as to enhance the Q of the LC notch filter subsystem; and selectively disabling or enabling the Q-enhancement circuit into or out of the notch filter subsystem responsive to a transmit signal power level in the transceiver.

13. The method of claim 12 wherein the Q-enhancement circuit is selectively switched out of the notch filter subsystem at low and medium transmit signal power levels and selectively switched into the notch filter subsystem at high transmit signal power levels.

14. The method of claim 12 further comprising adjusting, responsive to the transmit power level, a zero of LC notch filter transfer characteristic.

* * * * *